(12) United States Patent
Wu

(10) Patent No.: US 9,503,037 B2
(45) Date of Patent: Nov. 22, 2016

(54) CAVITY FILTER, POWER AMPLIFYING MODULE

(71) Applicant: SHENZHEN TATFOOK TECHNOLOGY CO., LTD., Shenzhen, Guangdong Province (CN)

(72) Inventor: Wenjing Wu, Shenzhen (CN)

(73) Assignee: SHENZHEN TATFOOK TECHNOLOGY CO., LTD., Shenzhen, Guangdong Province (CN)

( * ) Notice: Subject to any disclaimer, the term of this patent is extended or adjusted under 35 U.S.C. 154(b) by 134 days.

(21) Appl. No.: 14/385,771

(22) PCT Filed: Mar. 15, 2013

(86) PCT No.: PCT/CN2013/072757
§ 371 (c)(1),
(2) Date: Sep. 16, 2014

(87) PCT Pub. No.: WO2013/135206
PCT Pub. Date: Sep. 19, 2013

(65) Prior Publication Data
US 2015/0102873 A1 Apr. 16, 2015

(30) Foreign Application Priority Data
Mar. 16, 2012 (CN) .......................... 2012 1 0069861
Dec. 20, 2012 (CN) .......................... 2012 2 0710710

(51) Int. Cl.
*H01P 1/202* (2006.01)
*H03F 3/24* (2006.01)
(Continued)

(52) U.S. Cl.
CPC .............. *H03F 3/245* (2013.01); *H01P 1/207* (2013.01); *H01P 1/2053* (2013.01); *H01P 3/12* (2013.01);
(Continued)

(58) Field of Classification Search
CPC ......... H01P 1/202; H01P 1/2053; H01P 7/04
USPC ......................... 333/206, 207, 222, 223, 224
See application file for complete search history.

(56) References Cited

U.S. PATENT DOCUMENTS 4,568,895 A 2/1986 Reed
4,636,759 A * 1/1987 Ishikawa ................. H01P 1/202
333/206

(Continued)

FOREIGN PATENT DOCUMENTS

CN 2775977 Y 4/2006
CN 102136616 A 7/2011
(Continued)

*Primary Examiner* — Stephen E Jones
(74) *Attorney, Agent, or Firm* — Cheng-Ju Chiang

(57) ABSTRACT

A cavity filter is disclosed, which comprises a cavity, a cover plate, and a connector inner conductor disposed within the cavity, wherein the connector inner conductor passes through the cover plate to be connected with an external circuit board, the connector inner conductor comprises a first inner conductor and a second inner conductor, the first inner conductor is connected with a signal transmission point on the external circuit board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor. A power amplifying module and a signal transceiving device are also disclosed.

16 Claims, 6 Drawing Sheets

(51) Int. Cl.
*H01P 1/207* (2006.01)
*H01P 1/205* (2006.01)
*H01P 3/12* (2006.01)
*H03F 3/19* (2006.01)
*H04B 1/04* (2006.01)
*H01P 7/04* (2006.01)

(52) U.S. Cl.
CPC . *H01P 7/04* (2013.01); *H03F 3/19* (2013.01); *H04B 1/04* (2013.01); *H03F 2200/165* (2013.01); *H03F 2200/171* (2013.01); *H03F 2200/294* (2013.01); *H03F 2200/451* (2013.01); *H03F 2203/21112* (2013.01); *H04B 2001/045* (2013.01)

(56) References Cited

U.S. PATENT DOCUMENTS

| | | | | |
|---|---|---|---|---|
| 2002/0145490 | A1* | 10/2002 | Sauder | H01P 1/2053 333/202 |
| 2010/0029332 | A1* | 2/2010 | Fox | H01Q 3/28 455/561 |
| 2013/0142089 | A1* | 6/2013 | Azarnaminy | H03H 7/0161 370/277 |

FOREIGN PATENT DOCUMENTS

| | | |
|---|---|---|
| CN | 202004124 U | 10/2011 |
| CN | 102593560 A | 7/2012 |
| CN | 202564513 U | 11/2012 |

* cited by examiner

US 9,503,037 B2

CAVITY FILTER, POWER AMPLIFYING MODULE

CROSS REFERENCE TO RELATED APPLICATIONS

The present application is a 35 U.S.C. §371 National Phase conversion of International (PCT) Patent Application No. PCT/CN2013/072757, filed on Mar. 15, 2013, the disclosure of which is incorporated by reference herein. The PCT International Patent Application was filed and published in Chinese.

FIELD OF THE INVENTION

Embodiments of the present disclosure generally relates to the technical field of communications, and more particularly, to a way in which a connector inner conductor in a cavity filter is connected with an external circuit board, as well as a power amplifying module and a signal transceiving device.

BACKGROUND OF THE INVENTION

As a kind of frequency selecting devices, cavity filters are widely used in the communication field. Because of the special requirements on signal transmission of the cavity filters, interconnections of individual components of such a cavity filter with each other and with external connectors are required to be very precise.

Referring to FIG. 1, there is shown a schematic partial cross-sectional view of a cavity filter in the prior art, where a part of an external circuit board connected with the cavity filter is also shown.

As shown in FIG. 1, the cavity filter comprises a cavity 100, a cover plate 110, a connector outer conductor 120 and a connector inner conductor 130.

Briefly speaking, the cover plate 110 covers the cavity 100. The connector outer conductor 120 is connected with the cover plate 110, and the connector inner conductor 130 is disposed inside the connector outer conductor 120 and passes through the cover plate 110 to be connected with a signal transmission point of an external circuit board 150 outside the cavity filter. Generally, the connector outer conductor 120 and the connector inner conductor 130 are designed to be coaxial with each other to form a signal transmission structure. The connector outer conductor 120 is further provided with an electrically conductive isolation adhesive 124 to prevent signal leakage.

In the process of researching and practicing of the prior art, the present inventor has found that, in the prior art, there are the following problems because of the manufacturing errors and device errors of the inner conductor 130 and the circuit board 150: if a height of the inner conductor 130 is lower than an assembly reference level, a gap h usually results therebetween to cause distortion of the circuit board after the inner conductor is connected with the circuit board; and if the height of the inner conductor 130 is higher than the assembly reference level, the inner conductor 130 will lift the circuit board 150 up to also cause distortion of the circuit board 150. This makes it impossible to keep good touch between the connector inner conductor 130 and the signal transmission point of the external circuit board 150 outside the cavity filter.

SUMMARY OF THE INVENTION

To overcome the shortcoming that the circuit board tends to be distorted when the inner connector is connected with the circuit board in the prior art, the present disclosure provides a cavity filter, a power amplifying module and a signal transceiving device that can well solve the problem with the prior art.

The present disclosure provides a cavity filter, comprising a cavity, a cover plate, and a connector inner conductor disposed within the cavity, wherein the connector inner conductor passes through the cover plate to be connected with an external circuit board, the connector inner conductor comprises a first inner conductor and a second inner conductor, the first inner conductor is connected with a signal transmission point on the external circuit board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor.

The present disclosure provides a cavity filter, comprising a cavity, a cover plate, and a connector inner conductor disposed within the cavity, wherein the connector inner conductor passes through the cavity to be connected with an external circuit board, the connector inner conductor comprises a first inner conductor and a second inner conductor, the first inner conductor is connected with a signal transmission point on the external circuit board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor.

The present disclosure further provides a power amplifying module, comprising a cavity filter and a power amplifying board, wherein the cavity filter comprises a cavity, a cover plate, and a connector inner conductor disposed within the cavity, wherein the connector inner conductor passes through the cover plate to be connected with the power amplifying board, the connector inner conductor comprises a first inner conductor and a second inner conductor, the first inner conductor is connected with a signal transmission point on the power amplifying board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the power amplifying board via the structural capacitor.

In the present disclosure, a structure in which a structural capacitor is provided on the connector inner conductor is adopted so that the difference in height between the connector inner conductor and the circuit board is compensated by extension or contraction of the structural capacitor when the connector inner conductor and the circuit board are connected with each other. This prevents the problem with the prior art that utilizing the flexibility of the circuit board to compensate for the errors tends to damage the circuit board during assembly, and makes the detachment convenient, so the manufacturing cost of the product is significantly decreased. Because the cavity filter of the present disclosure is used for filtering high-frequency signals, the structural capacitor can be used to optimize filtering of signals by adjusting capacitance of the structural capacitor without affecting the signal transmission when high-frequency signals are transmitted through the connector.

The cavity filter, the power amplifying module and the signal transceiving device provided in embodiments of the present disclosure make an improvement on the way in which the circuit board is connected with the connector inner conductor so that relative positional errors between the connector inner conductor and the signal transmission point of the circuit board can be eliminated to ensure good contact between the connector inner conductor and the signal transmission point of the external circuit board outside the cavity filter. Furthermore, by dividing the connector inner conductor into a first inner conductor and a second inner conductor with a gap therebetween to form the structural capacitor, the present disclosure greatly improves the reliability in connection between the connector inner conductor of the cavity filter and the circuit board, makes the circuit board less liable to damage and can ensure good transmission of signals.

BRIEF DESCRIPTION OF THE DRAWINGS

To describe the technical solutions of embodiments of the present disclosure more clearly, the attached drawings necessary for description of the embodiments will be introduced briefly hereinbelow. Obviously, these attached drawings only illustrate some of the embodiments of the present disclosure, and those of ordinary skill in the art can further obtain other attached drawings according to these attached drawings without making inventive efforts.

DETAILED DESCRIPTION OF THE INVENTION

Hereinbelow, technical solutions of embodiments of the present disclosure will be described clearly and fully with reference to the attached drawings. Obviously, embodiments described herein are only some of but not all of the embodiments of the present disclosure. All other embodiments that can be obtained without making inventive efforts by those of ordinary skill in the art upon reviewing the disclosures of the embodiments of the present disclosure shall fall within the scope of the present disclosure.

Embodiment I

Figure 1:
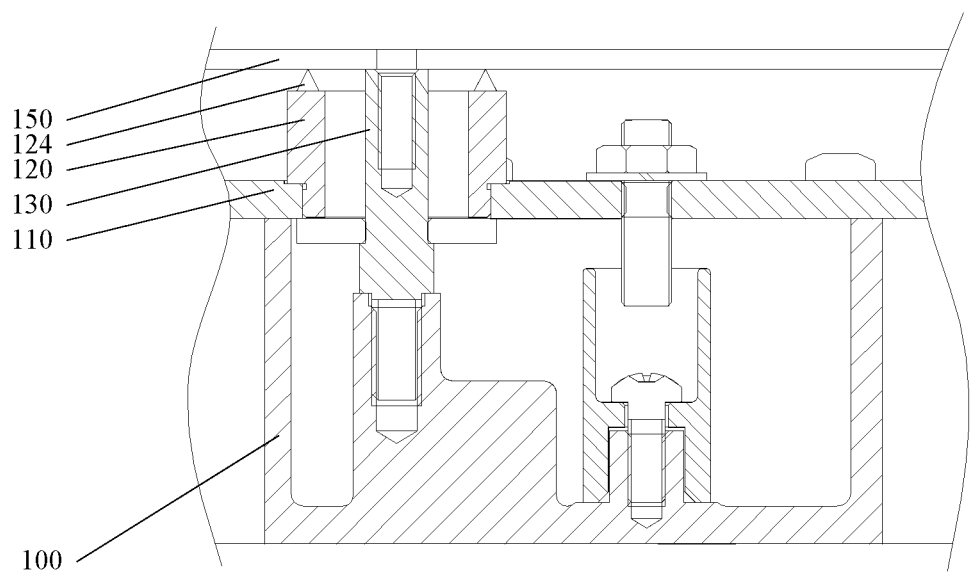
FIG. 1 is a partial cross-sectional view illustrating connection between a cavity filter and a circuit board in the prior art.
Figure 2:
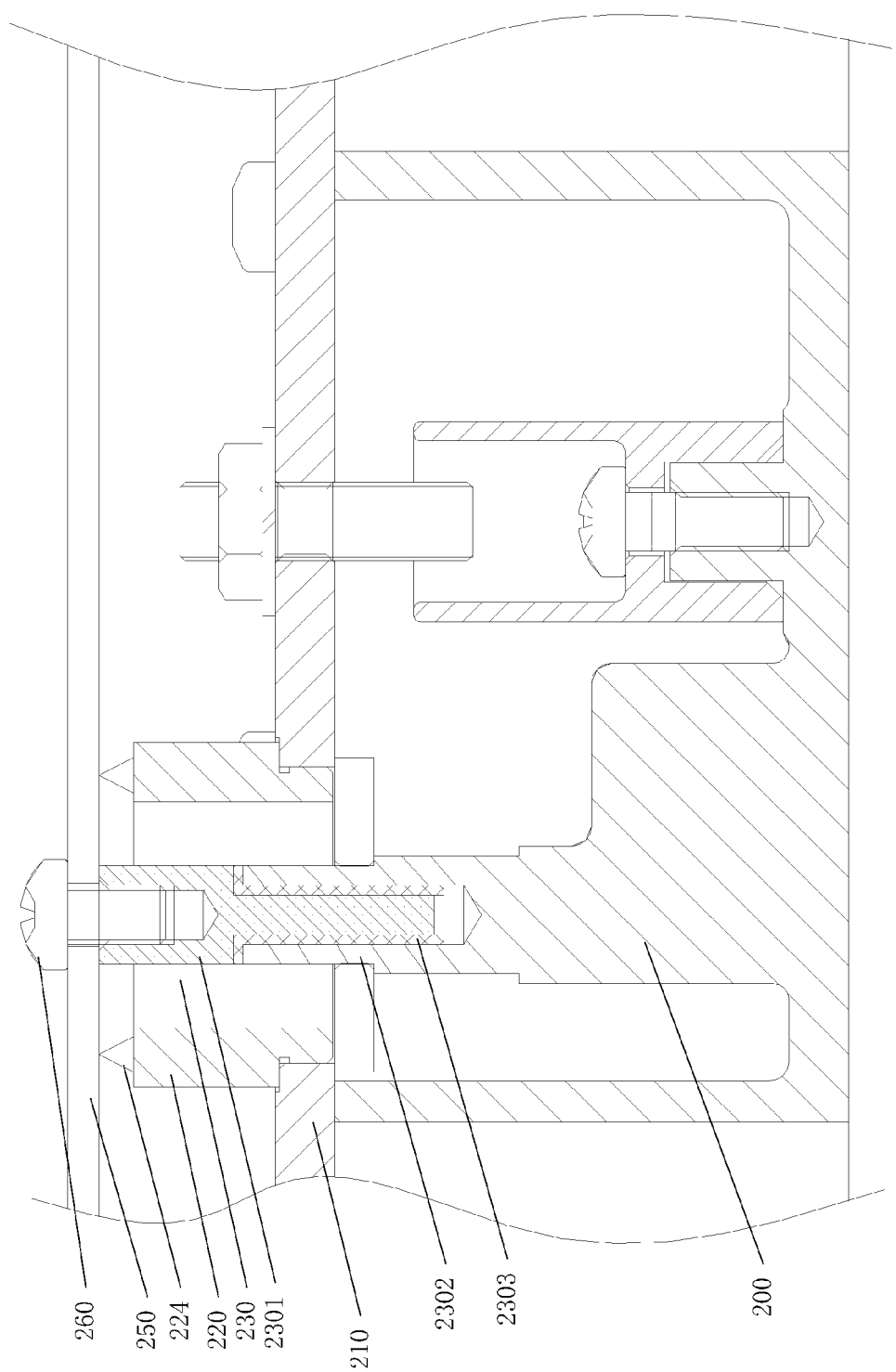
FIG. 2 is a partial cross-sectional view illustrating connection between a cavity filter and a circuit board in an embodiment of the present disclosure.

A cavity filter, as shown in FIG. 2, comprises a cavity 200, a cover plate 210, and a connector inner conductor 230 disposed within the cavity 200. The connector inner conductor 230 passes through the cover plate 210 to be connected with an external circuit board 250, the connector inner conductor 230 comprises a first inner conductor 2301 and a second inner conductor 2302, the first inner conductor 2301 is connected with a signal transmission point on the external circuit board 250, the second inner conductor 2302 is connected with an internal signal transmission point inside the cavity 200, the first inner conductor 2301 and the second inner conductor 2302 have a gap therebetween and cooperate with each other to form a structural capacitor, and the internal signal transmission point is connected with the signal transmission point on the external circuit board 250 via the structural capacitor.

A radio frequency (RF) low-noise amplifier connected with a signal transmission point may be further disposed on the external circuit board 250.

An RF power amplifier connected with a signal transmission point, a circulator connected with the RF low-noise amplifier, and a combiner connected with the RF power amplifier may also be disposed on the external circuit board 250, and the circulator is connected with the combiner.

The cover plate 210 covers the cavity 200. The connector outer conductor 220 is connected with the cover plate 210, and the connector inner conductor 230 is disposed inside the connector outer conductor 220 and passes through the cover plate 210 to be connected with the external circuit board 250 outside the cavity filter. The connector outer conductor 220 and the connector inner conductor 230 are designed to be coaxial with each other to form a signal transmission structure. The connector outer conductor 220 is further provided with an electrically conductive isolation adhesive 224 to prevent signal leakage.

The first inner conductor 2301 and the second inner conductor 2302 have a gap therebetween so that a structural capacitor can be formed between the first inner conductor 2301 and the second inner conductor 2302 to further transmit signals through capacitive coupling between the cavity 200 and the circuit board 250.

The internal signal transmission point inside the cavity 200 may be disposed on the cavity 200 or on a resonant rod inside the cavity 200, and the second inner conductor 2302 is connected to the cavity 200 or to the resonant rod.

In this embodiment, the second inner conductor 2302 is formed with a lumen and is fixed to the cavity 200, and the first inner conductor 2301 is inserted into the lumen of the second inner conductor 2302 with a gap existing between the first inner conductor 2301 and the second inner conductor 2302. The second inner conductor 2302 may be formed integrally with the cavity 200, and the first inner conductor 2301 is inserted into the lumen of the second inner conductor 2302 with a gap existing between the first inner conductor 2301 and the second inner conductor 2302. By forming the second inner conductor 2302 integrally with the cavity 200, the second inner conductor 2302 can be well joined with the cavity 200 and the manufacturing process can become simpler and more convenient.

In other embodiments, it is also possible that a lumen is formed in the first inner conductor 2301 and the second inner conductor 2302 is inserted into the lumen of the first inner conductor 2301 with a gap existing between the first inner conductor 2301 and the second inner conductor 2302.

The second inner conductor 2302 may also be connected to a resonant rod for purpose of transmitting signals between the circuit board 250 and the resonant rod.

The first inner conductor 2301 and the external circuit board 250 may also be connected together by a bolt 260.

Figure 3:
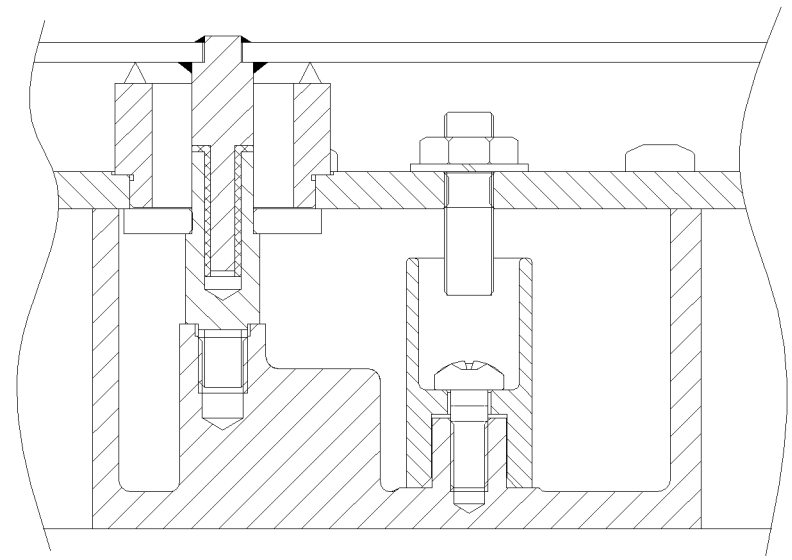
FIG. 3 is a partial cross-sectional view illustrating connection between another cavity filter and a circuit board in an embodiment of the present disclosure.

As shown in FIG. 3, the first inner conductor 2301 and the external circuit board 250 may also be connected together through welding.

Figure 4:
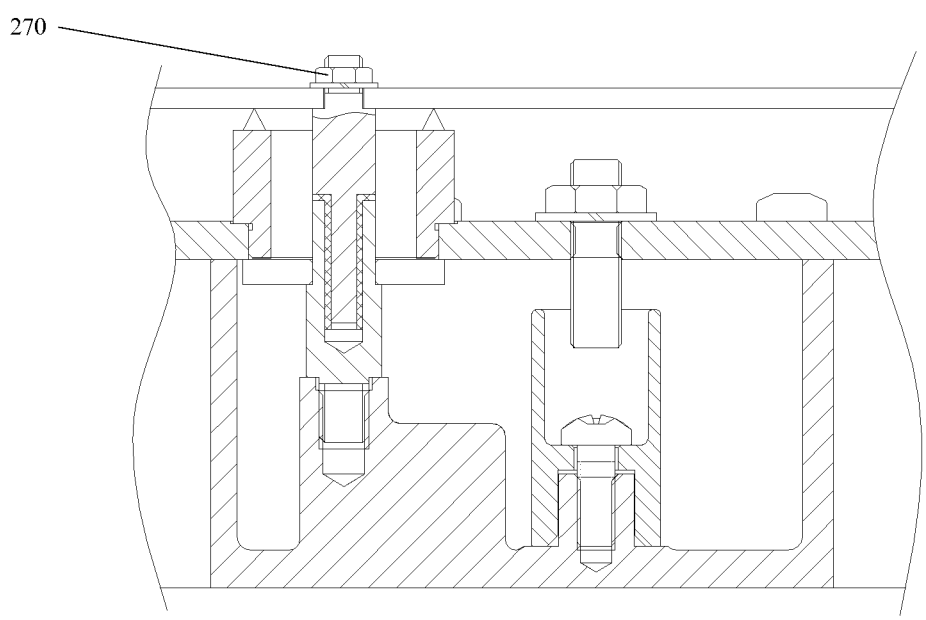
FIG. 4 is a partial cross-sectional view illustrating connection between a further cavity filter and a circuit board in an embodiment of the present disclosure.

As shown in FIG. 4, the first inner conductor 2301 and the external circuit board 250 may also be connected together by a nut 270.

When the first inner conductor 2301 and the external circuit board 250 are connected together by a bolt 260 or a nut 270, the maximum compression height of the structural capacitor portion of the connector inner conductor 230 is lower than an installation height of the circuit board 250, and provided that the capacitance value satisfies the need (i.e., satisfies the requirements of signal transmission and filtering), the maximum extension height of the structural capacitor of the connector inner conductor 230 can satisfy the connection requirement.

The actual capacitance value of the structural capacitor may be optimized and adjusted by those skilled in the art depending on the practical parameter design requirements so that not only the tolerance requirement of the present disclosure is satisfied, but also optimal filtering can be achieved.

In the embodiment of the present disclosure, the hard-wired inner conductor in the prior art technical solution is divided into the first inner conductor 2301 and the second inner conductor 2302. Firstly the second inner conductor 2302 is assembled to the cavity 200, then the first inner conductor 2301 is assembled, and the first inner conductor 2301 and the circuit board 250 are connected together by means of a screw, a nut or welding. Because the first inner conductor 2301 and the second inner conductor 2302 have a gap therebetween, they can move relative to each other axially within a small range so as to eliminate the gap or interference between the first inner conductor 2301 and the circuit board 250; and meanwhile, a capacitor is formed between the first inner conductor 2301 and the second inner conductor 2302 so that signal transmission can be achieved through capacitive coupling.

The cavity filter provided in embodiments of the present disclosure makes an improvement on the way in which the circuit board 250 is connected with the connector inner conductor 230 so that relative positional errors between the connector inner conductor 230 and the signal transmission point of the circuit board 250 can be eliminated to ensure good contact between the connector inner conductor 230 and the signal transmission point of the external circuit board 250 outside the cavity filter. Furthermore, by dividing the connector inner conductor 230 into a first inner conductor 2301 and a second inner conductor 2302 with a gap therebetween to form the structural capacitor, the present disclosure greatly improves the reliability in connection between the connector inner conductor 230 of the cavity filter and the circuit board 250, makes the circuit board 250 less liable to damage and can ensure good transmission of signals.

Further, an insulation medium 2303 is disposed between the first inner conductor 2301 and the second inner conductor 2302, and the structural capacitor is formed by the first inner conductor 2301, the second inner conductor 2302 and the insulation medium 2303. The insulation medium 2303 is located on the first inner conductor 2301 or the second inner conductor 2302, and may be disposed on the first inner conductor 2301 or the second inner conductor 2302 though machining, injection molding or surface spraying. The insulation medium may be any insulation material, but is preferably polytetrafluoroethylene (PTFE).

A last-stage output capacitor is disposed on the circuit board 250, and the structural capacitor formed between the first inner conductor 2301 and the second inner conductor 2302 may replace the last-stage output capacitor disposed on the circuit board 250. The structural capacitor formed between the first inner conductor 2301 and the second inner conductor 2302 may be adjusted according to the frequency, for example, by changing the lengths, sizes or thicknesses of the first inner conductor 2301 and the second inner conductor 2302 or by changing the material of the insulation medium 2303.

Hereinbelow, the influence of the structure, in which the inner conductor 230 is divided into the first inner conductor 2301 and the second inner conductor 2302 to form the structural capacitor, on the signal transmission will be described with reference to a specific simulation test.

Figure 5:
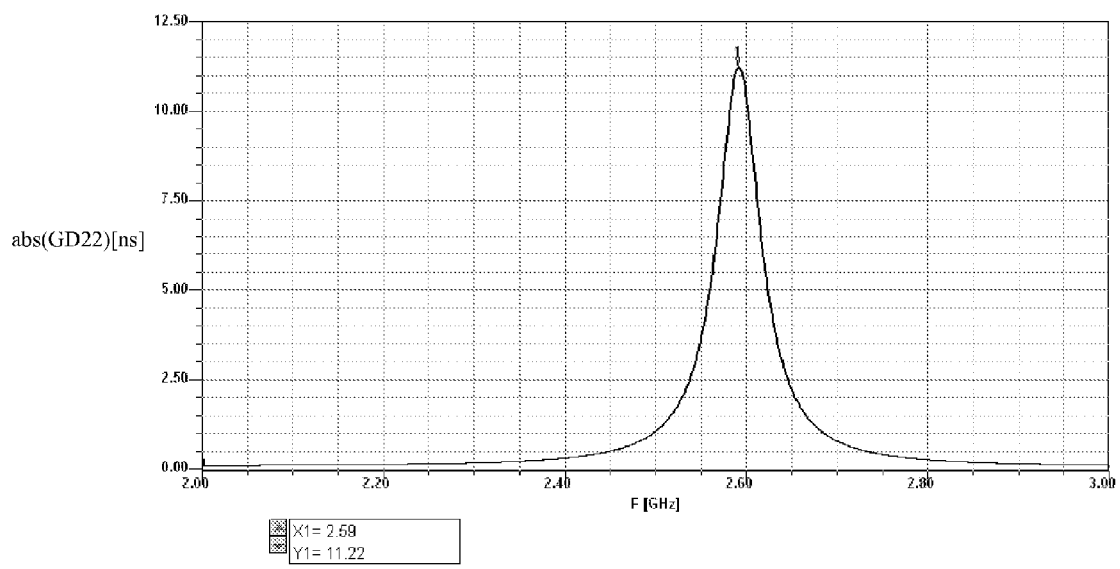
FIG. 5 is a graph of frequency versus time delay of a signal transmitted from a circuit board to a cavity via an inner conductor in the prior art.

FIG. 5 shows a graph of frequency versus time delay of a signal transmitted from a circuit board to a cavity via an inner conductor in the prior art. As can be seen, the horizontal axis represents the frequency value, and the vertical axis represents the time delay. When the frequency value is 2.59 GHz, the time delay reaches a maximum value of 11.22 ns.

Figure 6:
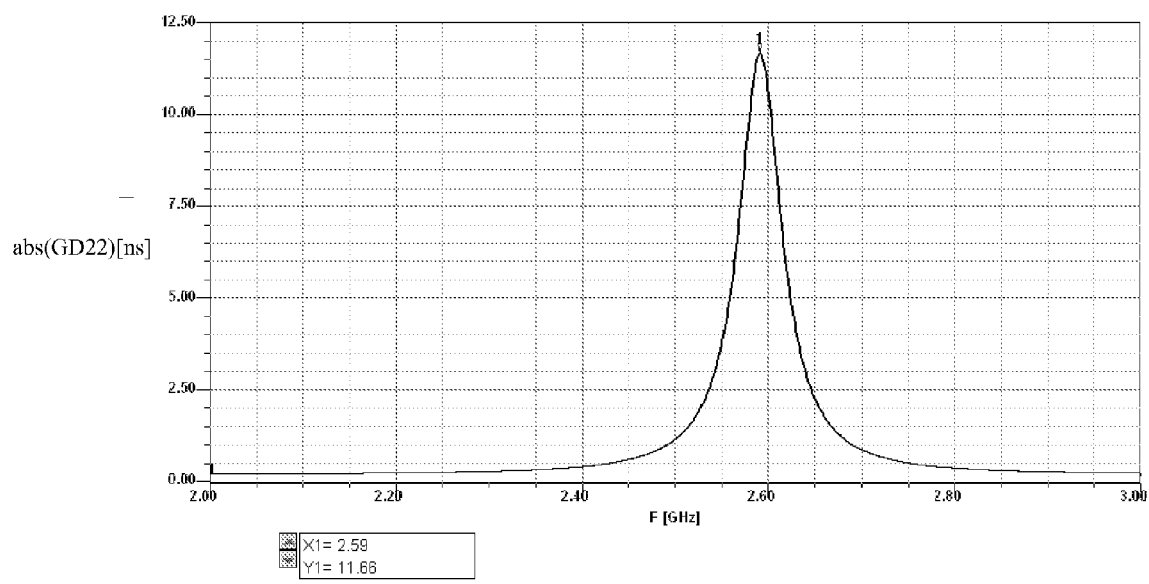
FIG. 6 is a graph of frequency versus time delay of a signal transmitted from a circuit board to a cavity via an inner conductor in an embodiment of the present disclosure.

FIG. 6 shows a graph of frequency versus time delay of a signal transmitted from the circuit board 250 to the cavity via the first inner conductor 2301, the structural capacitor and the second inner conductor 2302 in an embodiment of the present disclosure. As can be seen, the horizontal axis represents the frequency value, and the vertical axis represents the time delay. When the frequency value is 2.59 GHz, the time delay reaches a maximum value of 11.66 ns.

It can be known from the aforesaid simulation test results that, the difference in time delay between the embodiment of the present disclosure and the prior art is 0.44 ns. In signal transmission of filters, a delay difference of within 1 ns can be ignored for the signal time delay caused by the inner conductor 230 and has no influence on the signal transmission in the cavity 200.

According to the embodiment of the present disclosure, the inner conductor is divided into the first inner conductor 2301 and the second inner conductor 2302, and the insulation medium 2303 is disposed between the first inner conductor 2301 and the second inner conductor 2302 so that a structural capacitor is formed by the first inner conductor 2301, the second inner conductor 2302 and the insulation medium 2303. This can eliminate the relative positional error between the connector inner conductor 230 and the signal transmission point of the circuit board 250 to ensure good contact between the connector inner conductor 230 and the signal transmission point of the external circuit board 250 outside the cavity filter; and moreover, the last-stage output capacitor on the original circuit board can be replaced to reduce the manufacturing cost of the circuit board without influencing the signal transmission effect.

The cavity filter in this embodiment may be a frequency selecting apparatus such as a duplexer, a combiner or a tower mounted amplifier.

Embodiment II

A cavity filter, comprising a cavity, a cover plate, and a connector inner conductor disposed within the cavity, wherein the connector inner conductor passes through the cavity to be connected with an external circuit board, the connector inner conductor comprises a first inner conductor and a second inner conductor, the first inner conductor is connected with a signal transmission point on the external circuit board, for example, through riveting, crimping, muff-coupling, welding or screwing, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor.

An RF low-noise amplifier connected with a signal transmission point may be further disposed on the external circuit board.

An RF power amplifier connected with a signal transmission point, a circulator connected with the RF low-noise amplifier, and a combiner connected with the RF power amplifier may also be disposed on the external circuit board, and the circulator is connected with the combiner.

The first inner conductor and the second inner conductor has a gap therebetween so that the structural capacitor is formed between the first inner conductor and the second inner conductor to further transmit signals between the cavity and the power amplifying board through capacitive coupling.

The cavity is disposed in an inverted form with the cover plate being located at the bottom of the cavity, a hole is formed at the bottom of the cavity for the inner conductors to pass therethrough, the internal signal transmission point inside the cavity may be disposed on the cavity or on a resonant rod inside the cavity or on the cover plate, and the second inner conductor is connected to the cavity or connected to the resonant rod or the cover plate.

In an implementation, the second inner conductor is formed with a lumen and fixed to the cavity, and the first inner conductor is inserted into the lumen of the second inner conductor with a gap existing between the first inner conductor and the second inner conductor.

In another implementation, the second inner conductor is formed with a lumen and is formed integrally with the cavity, and the first inner conductor is inserted into the lumen of the second inner conductor with a gap existing between the first inner conductor and the second inner conductor. By forming the second inner conductor integrally with the cavity, the second inner conductor and the cavity can be well joined together and the manufacturing process can be made simpler and more convenient.

In yet another implementation, the first inner conductor is formed with a lumen, and the second inner conductor is inserted into the lumen of the first inner conductor with a gap existing between the first inner conductor and the second inner conductor.

The second inner conductor may also be connected to the resonant rod for purpose of transmitting signals between the power amplifying board and the resonant rod.

Further, an insulation medium is disposed between the first inner conductor and the second inner conductor, and the structural capacitor is formed by the first inner conductor, the second inner conductor and the insulation medium. The insulation medium is located on the first inner conductor or the second inner conductor, and may be disposed on the first inner conductor or the second inner conductor though machining, injection molding or surface spraying. The insulation medium may be any insulation material, but is preferably polytetrafluoroethylene (PTFE).

The cavity filter provided in the embodiment of the present disclosure makes an improvement on the way in which the power amplifying board is connected with the connector inner conductor so that relative positional errors between the connector inner conductor and the signal transmission point of the power amplifying board can be eliminated to ensure good contact between the connector inner conductor and the signal transmission point of the power amplifying board outside the cavity filter. Furthermore, by dividing the connector inner conductor into a first inner conductor and a second inner conductor with a gap therebetween to form the structural capacitor, the present disclosure greatly improves the reliability in connection between the connector inner conductor of the cavity filter and the power amplifying board, makes the power amplifying board less liable to damage and can ensure good transmission of signals.

Embodiment III

A power amplifying module, as shown in FIG. 2, comprises a cavity filter shown in FIG. 2 and a power amplifying board (e.g., the circuit board 250 shown in FIG. 2), wherein the cavity filter comprises a cavity 200, a cover plate 210, and a connector inner conductor 230 disposed within the cavity 200, the connector inner conductor 230 passes through the cover plate 210 to be connected with the power amplifying board, the connector inner conductor 230 comprises a first inner conductor 2301 and a second inner conductor 2302, the first inner conductor 2301 is connected with a signal transmission point on the power amplifying board, the second inner conductor 2302 is connected with an internal signal transmission point inside the cavity 200, the first inner conductor 2301 and the second inner conductor 2302 have a gap therebetween and cooperate with each other to form a structural capacitor, and the internal signal transmission point is connected with the signal transmission point on the power amplifying board via the structural capacitor.

A last-stage output capacitor is disposed on the power amplifying board to filter transmission signals.

In an implementation, the first inner conductor 2301 and the second inner conductor 2302 with a gap therebetween cooperate to form a structural capacitor, and the structural capacitor is only used to transmit signals entering into the cavity and to eliminate the relative positional errors between the connector inner conductor and the signal transmission point of the power amplifying board.

In an implementation, the structural capacitor can replace the last-stage output capacitor disposed on the power amplifying board to filter the transmission signals. By designing appropriate lengths and spacing for the first inner conductor 2301 and the second inner conductor 2302 and appropriately choosing the material of the insulation medium (e.g., PTFE), the structural capacitor formed between the first inner conductor 2301 and the second inner conductor 2302 can be used to replace the original last-stage output capacitor on the power amplifying board. This can not only eliminate the relative positional errors between the connector inner conductor and the signal transmission point of the power amplifying board, but also reduce the manufacturing cost of the power amplifying board.

In another implementation, the last-stage output capacitor and the structural capacitor match with each other to filter transmission signals. The first inner conductor 2301 and the second inner conductor 2302 with a gap therebetween cooperate with each other to form the structural capacitor, which is used to match with the last-stage output capacitor disposed on the power amplifying board. Because the last-stage output capacitor is relatively expensive, a cheap capacitor may be used to replace the last-stage output capacitor. Thereby, not only the relative positional errors between the connector inner conductor and the signal transmission point of the power amplifying board can be eliminated, but also the manufacturing cost of the power amplifying board can be reduced.

Embodiment IV

Figure 7:
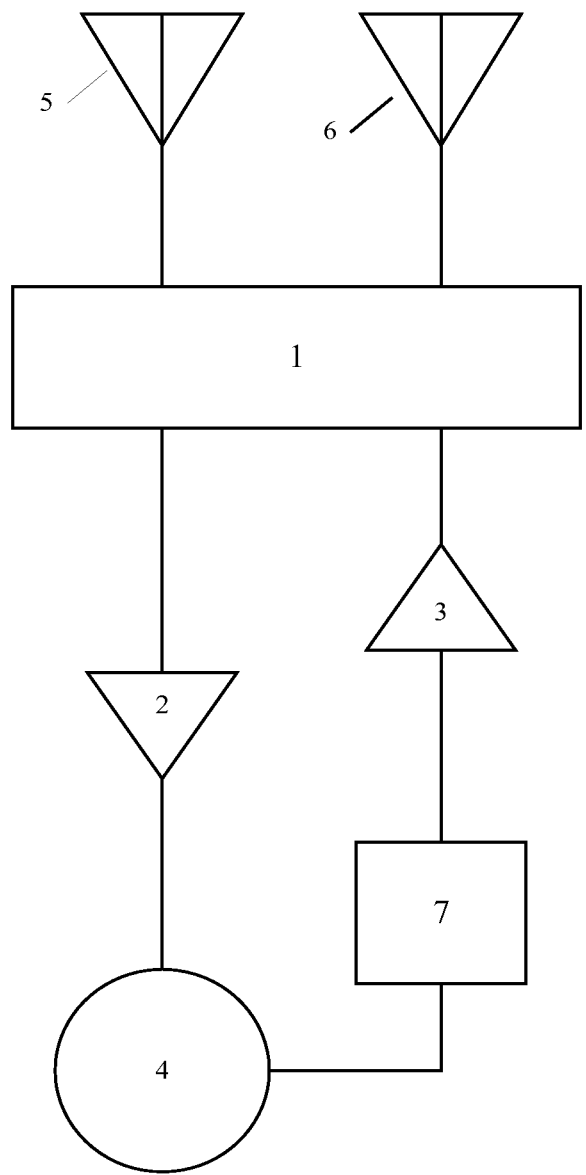
FIG. 7 is a block diagram of a signal transceiving device according to a fourth embodiment of the present disclosure.

A signal transceiving device, as shown in FIG. 7, comprises: the cavity filter 1 as described above, being connected with a receiving antenna 5 and configured to filter a signal received; a radio frequency (RF) low-noise amplifier 2, being connected with a signal output terminal of the cavity filter 1; a circulator 4, being connected with a signal output terminal of the low-noise amplifier 2; a combiner 7, being connected with the circulator 4; an RF power amplifier 3, having an input terminal connected with a signal output terminal of the combiner 7 and an output terminal connected with the cavity filter 1; and a transmitting antenna 6, being configured to receive an output signal from the cavity filter 1 and transmit the output signal.

In the cavity filter (see FIG. 2) of the signal transceiving device according to the embodiment of the present disclosure, the inner conductor 230 is divided into the first inner conductor 2301 and the second inner conductor 2302, and the insulation medium 2303 is disposed between the first inner conductor 2301 and the second inner conductor 2302 so that a structural capacitor is formed by the first inner conductor 2301, the second inner conductor 2302 and the insulation medium 2303. This can eliminate the relative positional error between the connector inner conductor 230 and the signal transmission point of the circuit board 250 to ensure good contact between the connector inner conductor 230 and the signal transmission point of the external circuit board 250 outside the cavity filter; and moreover, the last-stage output capacitor on the original circuit board can be replaced to reduce the manufacturing cost of the circuit board 250 without influencing the signal transmission effect.

Specific examples have been described herein to illustrate the principles and implementations of the present disclosure. However, the description of the aforesaid embodiments is only intended to facilitate understanding of the methods and core ideas of the present disclosure; and meanwhile, modifications may be made to the specific implementations and the application scope by those of ordinary skill in the art according to the spirits of the present disclosure, so the disclosure of this specifications shall not be construed to limit the present disclosure.

What is claimed is:

1. A cavity filter, comprising a cavity, a cover plate, and a connector inner conductor disposed within the cavity, wherein the connector inner conductor passes through the cover plate to be connected with an external circuit board, the connector inner conductor comprises a first inner conductor and a second inner conductor, the first inner conductor is connected with a signal transmission point on the external circuit board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor; the second inner conductor is formed integrally with the cavity.

2. The cavity filter of claim 1, wherein the second inner conductor is formed with a lumen and the first inner conductor is inserted into the lumen of the second inner conductor, or the first inner conductor is formed with a lumen and the second inner conductor is inserted into the lumen of the first inner conductor.

3. The cavity filter of claim 1, wherein the first inner conductor is connected with the external circuit board through riveting, crimping, muff-coupling, welding or screwing.

4. The cavity filter of claim 1, wherein a radio frequency (RF) low-noise amplifier connected with the signal transmission point, an RF power amplifier connected with the signal transmission point, a circulator connected with the RF low-noise amplifier, and a combiner connected with the RF power amplifier are disposed on the external circuit board, and the circulator is connected with the combiner.

5. The cavity filter of claim 1, wherein an insulation medium is disposed in the gap between the first inner conductor and the second inner conductor, and the structural capacitor is formed by the first inner conductor, the second inner conductor and the insulation medium.

6. The cavity filter of claim 5, wherein the insulation medium is polytetrafluoroethylene (PTFE).

7. A cavity filter, comprising a cavity, a cover plate, and a connector inner conductor disposed within the cavity, wherein the connector inner conductor passes through the cavity to be connected with an external circuit board, the connector inner conductor comprises a first inner conductor and a second inner conductor, the first inner conductor is connected with a signal transmission point on the external circuit board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the external circuit board via the structural capacitor; the second inner conductor is formed integrally with the cavity.

8. The cavity filter of claim 7, wherein the second inner conductor is formed with a lumen and the first inner conductor is inserted into the lumen of the second inner conductor, or the first inner conductor is formed with a lumen and the second inner conductor is inserted into the lumen of the first inner conductor.

9. The cavity filter of claim 7, wherein the first inner conductor is connected with the external circuit board through riveting, crimping, muff-coupling, welding or screwing.

10. The cavity filter of claim 7, wherein an RF (radio frequency) low-noise amplifier connected with the signal transmission point, an RF power amplifier connected with the signal transmission point, a circulator connected with the RF low-noise amplifier, and a combiner connected with the RF power amplifier are disposed on the external circuit board, and the circulator is connected with the combiner.

11. The cavity filter of claim 7, wherein an insulation medium is disposed in the gap between the first inner conductor and the second inner conductor, and the structural capacitor is formed by the first inner conductor, the second inner conductor and the insulation medium.

12. The cavity filter of claim 11, wherein the insulation medium is polytetrafluoroethylene (PTFE).

13. A power amplifying module, comprising a cavity filter and a power amplifying board, wherein the cavity filter comprises a cavity, a cover plate, and a connector inner conductor disposed within the cavity, wherein the connector inner conductor passes through the cover plate to be connected with the power amplifying board, the connector inner conductor comprises a first inner conductor and a second inner conductor, the first inner conductor is connected with a signal transmission point on the power amplifying board, the second inner conductor is connected with an internal signal transmission point inside the cavity, the first inner conductor and the second inner conductor have a gap therebetween and cooperate with each other to form a structural capacitor, and the internal signal transmission point is connected with the signal transmission point on the power amplifying board via the structural capacitor; the second inner conductor is formed integrally with the cavity.

14. The power amplifying module of claim 13, wherein a last-stage output capacitor is disposed on the power amplifying board to filter transmission signals.

15. The power amplifying module of claim 14, wherein the last-stage output capacitor on the power amplifying board is replaced by the structural capacitor to filter transmission signals.

16. The power amplifying module of claim 14, wherein the last-stage output capacitor and the structural capacitor cooperate with each other to filter transmission signals.

* * * * *